(12) United States Patent
Trutna, Jr. et al.

(10) Patent No.: US 7,429,904 B2
(45) Date of Patent: Sep. 30, 2008

(54) SPREAD-SPECTRUM RADIO UTILIZING MEMS COMPONENTS

(75) Inventors: William R. Trutna, Jr., Atherton, CA (US); Mark A. Unkrich, Emerald Hills, CA (US); Graham M. Flower, San Jose, CA (US)

(73) Assignee: Avago Technologies Wireless IP (Singapore) Pte Ltd, Singapore (SG)

( * ) Notice: Subject to any disclaimer, the term of this patent is extended or adjusted under 35 U.S.C. 154(b) by 284 days.

(21) Appl. No.: 11/262,178

(22) Filed: Oct. 28, 2005

(65) Prior Publication Data

US 2007/0096847 A1      May 3, 2007

(51) Int. Cl.
 *H03H 9/54* (2006.01)
 *H04B 1/00* (2006.01)

(52) U.S. Cl. .................. 333/187; 333/133; 375/130; 375/132; 375/140; 375/146; 375/147

(58) Field of Classification Search ........... 333/186, 333/187, 189, 133, 197–200
See application file for complete search history.

(56) References Cited

U.S. PATENT DOCUMENTS

| | | | |
|---|---|---|---|
| 4,933,953 A * | 6/1990 | Yagi ....................... | 375/149 |
| 5,748,623 A * | 5/1998 | Sawahashi et al. ...... | 370/342 |
| 6,204,737 B1 * | 3/2001 | Ella ........................ | 333/187 |
| 6,262,637 B1 | 7/2001 | Bradley et al. | |
| 6,680,660 B2 * | 1/2004 | Nguyen ................... | 333/133 |
| 6,703,763 B2 | 3/2004 | Tsai et al. | |
| 6,704,344 B1 * | 3/2004 | Hu et al. ................. | 375/130 |
| 6,724,278 B1 * | 4/2004 | Smith ...................... | 333/133 |
| 6,868,288 B2 | 3/2005 | Thompson | |
| 6,870,445 B2 * | 3/2005 | Kawakubo et al. ..... | 333/187 |
| 7,020,125 B2 * | 3/2006 | Schilling ................. | 370/342 |
| 7,230,928 B2 * | 6/2007 | Katz et al. .............. | 370/252 |
| 2005/0070232 A1 | 3/2005 | Mages | |

OTHER PUBLICATIONS

B.P. Otis, Y.H. Chee, RI Lu, N.M. Pletcher, J.M. Rabaey, "An Ultra-Low Power MEMS-Based Two-Channel Transceiver for Wireless Sensor Networks", Department of Electrical Engineering and Computer Science.

Brian P. Otis, Jan M. Rabaey, "A 300-uW 1.9 GHz CMOS Oscillator Utilizing Micromachined Resonators", IEEE Journal of Solid-State Circuits, vol. 38, No. 7, Jul. 2003.

* cited by examiner

*Primary Examiner*—Barbara Summons

(57) ABSTRACT

A spread-spectrum radio, such as a frequency-hopping spread-spectrum radio or a direct-sequence spread-spectrum radio, includes a transmitter that utilizes microelectromechanical systems (MEMS) based oscillation system to generate a spread-spectrum signal and/or a receiver that utilizes a MEMS-based frequency selection system to receive a spread-spectrum signal. In an embodiment, the MEMS-based oscillation system and the MEMS-based frequency selection system utilize MEMS resonators such as thin film bulk acoustic resonators (FBARs) that are fabricated in high density on a single substrate.

21 Claims, 7 Drawing Sheets

SPREAD-SPECTRUM RADIO UTILIZING MEMS COMPONENTS

BACKGROUND OF THE INVENTION

Because normal radio communications can be intercepted by anyone with a receiver, they lack the security required for transmission of classified information. During World War II, frequency hopping was used to make radio signals more difficult to detect and decode. In frequency hopping, the carrier frequency of a transmitter is rapidly switched among a large set of predetermined frequencies according to a sequence code that is known to the transmitter and must be known by a receiver to decode the communication. Although any radio can receive the frequency-hopped signal, only those radios that know the sequence code are able to decode the transmission. Conventional frequency-hopping radios use multiple fixed frequency voltage controlled oscillators and a switch or a fast-tuning voltage controlled oscillator to generate the different frequencies of the carrier signal. The size and power required by these voltage controlled oscillators can be limiting factors in producing compact power efficient radio devices.

SUMMARY OF THE INVENTION

A spread-spectrum radio, such as a frequency-hopping spread-spectrum radio or a direct-sequence spread-spectrum radio, includes a transmitter that utilizes microelectromechanical systems (MEMS) based oscillation system to generate a spread-spectrum signal and/or a receiver that utilizes a MEMS-based frequency selection system to receive a spread-spectrum signal. In an embodiment, the MEMS-based oscillation system and the MEMS-based frequency selection system utilize MEMS resonators such as thin film bulk acoustic resonators (FBARs) that are fabricated in high density on a single substrate. The FBAR resonators exhibit desirable performance characteristics including compact size, a high Q factor, and low power consumption. Because the transmitters and receivers utilize MEMS components to generate and filter a spread-spectrum signal, a spread-spectrum radio can be made much smaller and more energy efficient than conventional spread-spectrum radios.

Other aspects and advantages of the present invention will become apparent from the following detailed description, taken in conjunction with the accompanying drawings, illustrated by way of example of the principles of the invention.

BRIEF DESCRIPTION OF THE DRAWINGS

Throughout the description similar reference numbers may be used to identify similar elements.

DETAILED DESCRIPTION

A spread-spectrum radio, such as a frequency-hopping spread-spectrum radio or a direct-sequence spread-spectrum radio, includes a transmitter that utilizes microelectromechanical systems (MEMS) based oscillation system to generate a spread-spectrum signal and/or a receiver that utilizes a MEMS-based frequency selection system to receive a spread-spectrum signal. In an embodiment, the MEMS-based oscillation system and the MEMS-based frequency selection system utilize MEMS resonators such as thin film bulk acoustic resonators (FBARs) that are fabricated in high density on a single substrate.

Figure 1:
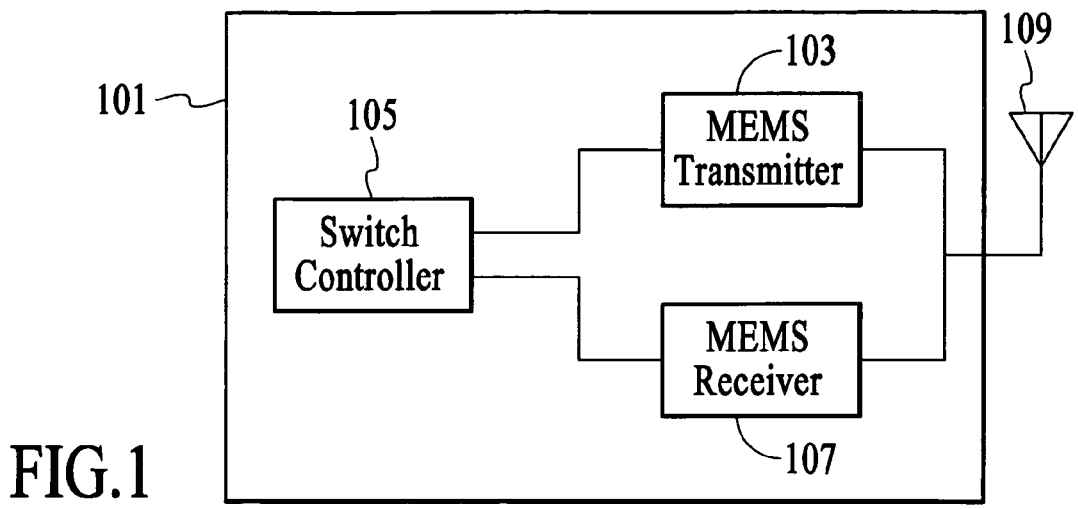
FIG. 1 depicts a frequency-hopping spread-spectrum radio including a MEMS transmitter, a MEMS receiver, and a switch controller.

FIG. 1 depicts a spread-spectrum radio 101 for transmitting and receiving a spread-spectrum signal that has information disposed thereon. In the embodiment of FIG. 1, the spread-spectrum radio utilizes frequency-hopping as is referred to as a frequency-hopping spread-spectrum (FHSS) radio. In an alternative embodiment, the spread-spectrum radio utilizes a direct-sequence spread-spectrum technique and is referred to as a direct-sequence spread-spectrum (DSSS) radio. The FHSS radio depicted in FIG. 1 includes a switch controller 105, a MEMS transmitter 103, a MEMS receiver 107, and an antenna 109. Over a fixed period of time, the switch controller generates a control signal according to a frequency-hopping algorithm embedded therein.

In transmission mode, the control signal generated from the switch controller 105 causes the MEMS transmitter 103 to select a pseudo-random succession of frequencies, one at a time, from among a predetermined set of frequencies, e.g. $f_1$-$f_n$ being generated by the FBAR transmitter. The order and duration of each selected frequency is determined by a frequency-hopping algorithm within the switch controller. The FBAR transmitter generates a spread-spectrum carrier signal defined by a succession of frequencies according to the sequence and duration dictated by the switch controller. The carrier signal has a single frequency at any one moment, selected from among the set of predetermined frequencies, e.g. $f_1$-$f_n$. The MEMS transmitter modulates the carrier signal to encode information thereon and the modulated carrier signal is transmitted from the antenna in the form of an RF signal.

In receive mode, an incoming signal is received by the antenna 109 of the frequency-hopping spread-spectrum radio 101 and is sent to the MEMS receiver 107 for processing. The switch controller 105 generates a control signal in response to a frequency-hopping algorithm which causes the MEMS receiver to select outputs, one at a time, from an array of MEMS resonators, with each MEMS resonator being configured to pass a different one of the frequencies $f_1$-$f_n$, and to filter out all other frequencies. If the frequency-hopping algorithm of the transmitting and receiving radios is identical and synchronized, the MEMS receiver of the receiving radio can anticipate the sequence and duration of the frequencies that form the received carrier signal. The MEMS receiver then demodulates the incoming carrier signal into a recovered information signal as shown and described in greater detail below in conjunction with FIG. 5. The recovered information signal can then be, for example, output to a speaker or stored on an appropriate storage medium.

Figure 2:
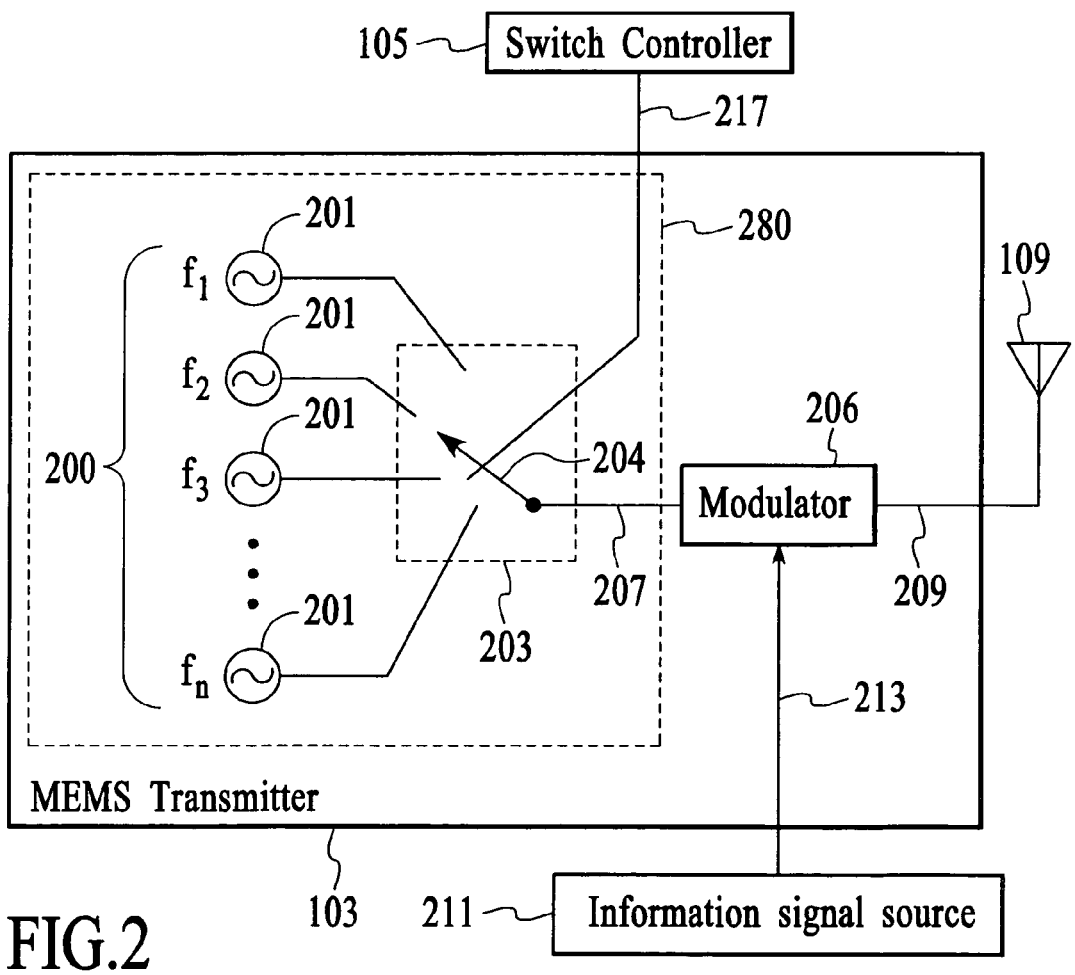
FIG. 2 depicts in greater detail the MEMS transmitter shown in FIG. 1.

FIG. 2 depicts an embodiment of the MEMS transmitter 103 from FIG. 1. The MEMS transmitter includes a MEMS-based oscillation system 280 and a modulator 206. The MEMS-based oscillation system includes an array 200 of MEMS oscillators 201 and a controllable switch 203. The switch controller 105 functions cooperatively with the MEMS transmitter to form a frequency-hopped carrier signal. The MEMS oscillators 201 generate signals with distinct carrier frequencies $f_1$-$f_n$. In an embodiment, frequencies $f_1$-$f_n$ fall within a frequency range of 0.6 GHz to 8.0 GHz. However, frequencies lower than 0.6 GHz and greater than 8.0 GHz can be used. The switch controller 105 generates a control signal using a frequency-hopping algorithm and provides the control signal to the controllable switch via signal path 217.

The controllable switch 203 has a switching element 204 configured to controllably select the output from any one of the MEMS oscillators 201 in response to a control signal received from the switch controller 105 via signal path 217. The control signal directs the controllable switch to select one MEMS oscillator at a time, switching between the MEMS oscillators (and therefore frequencies $f_1$-$f_n$) in a pseudo-random order according to the frequency-hopping algorithm. The switch controller 105 determines both the order and duration in which the switching element engages the MEMS oscillators. A frequency-hopped carrier signal is output from the controllable switch in response to the selection of the MEMS oscillators.

The modulator 206 is coupled to the controllable switch 203 via signal path 207, over which it receives the frequency-hopped carrier signal. The modulator is also coupled to an information signal source 211 via signal path 213, over which it receives an information signal. The output of the modulator is connected to the antenna 109 via signal path 209. Although not shown in FIG. 2, a power amplifier is often included in the signal path between the modulator and the antenna.

In operation, the MEMS oscillators 201 simultaneously generate signals of predetermined frequencies $f_1$-$f_n$ and the switch controller 105 generates a control signal using a frequency-hopping algorithm. The control signal is provided from the switch controller to the controllable switch 203 and directs the switch element 204 to select one MEMS oscillator at a time. The frequency-hopped carrier signal output by the controllable switch as a result of the MEMS oscillator selection is provided to the modulator 206. The information signal source 211 provides an information signal to the modulator and the modulator encodes the information signal onto the frequency-hopped carrier signal, thereby forming a modulated frequency-hopped carrier signal. The modulator can utilize any known modulation technique, including, but not limited to, frequency shift keying, phase-shift keying, or amplitude shift keying. The modulated frequency-hopped carrier signal is provided to the antenna 109 and is transmitted as an RF signal.

As the field of MEMS technology has advanced, radio frequency (RF) MEMS resonators have been fabricated on a silicon substrate using production techniques similar to those traditionally used in semiconductor fabrication. Using these fabrication techniques and materials, a high density of resonators can be formed at low cost on a silicon substrate. In addition to high density and low cost, MEMS resonators typically exhibit a high Q factor, or the ability to resonate at a very narrow RF bandwidth. In accordance with the invention, the MEMS transmitter and MEMS receiver utilize MEMS resonators to generate and filter the carrier frequencies. In one embodiment, the MEMS resonators are film bulk acoustic resonators (FBARs). FBARs are commercially practical species of MEMS resonators that can be fabricated as a metal-piezo-metal (metal-A1N-metal) sandwich which exhibits a tightly controlled resonance having a narrow bandwidth. Current production techniques can produce an FBAR in an area of 100 μm by 100 μm. In an FBAR-based embodiment of each MEMS oscillator 201, an FBAR is electrically connected to an amplifier to form an FBAR oscillator that is used to produce a signal at one of the frequencies $f_1$-$f_n$. In an embodiment, an amplifier is fabricated in the same substrate on which the FBAR is constructed. Although an FBAR is given as one example of a MEMS resonator, the present invention comprehends other MEMS-based resonators for use in conjunction with the receiver or transmitter of the claimed invention and is not limited to any one species or fabrication technique.

Figure 3:
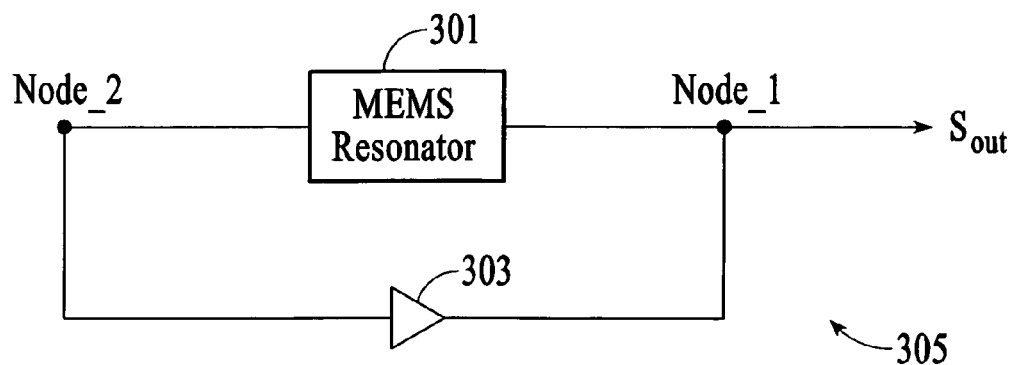
FIG. 3 depicts a MEMS oscillator from FIG. 2 formed from a MEMS resonator connected in parallel with a signal amplifier.

FIG. 3 depicts a generic MEMS oscillator 305 comprising a MEMS resonator 301 and a signal amplifier 303. A voltage imbalance between Node_1 and Node_2 initializes a resonant signal within the MEMS resonator. Without the signal amplifier, however, the signal produced by the MEMS resonator would rapidly attenuate. The MEMS resonator and the signal amplifier are therefore disposed in parallel between Node_1 and Node_2. From this circuit architecture, a resonant signal originally generated by the MEMS resonator is amplified by the signal amplifier and sustained as a steady state signal. Optimal circuit design of the signal amplifier and the MEMS resonator will generate an output signal, $S_{OUT}$, at Node_1 exhibiting appropriate bandwidth, amplitude, and signal to noise ratio to be used as a component of the carrier signal in a frequency-hopping spread-spectrum transmitter. According to an embodiment, the signal amplifier is an MOS amplifier.

Figure 4:
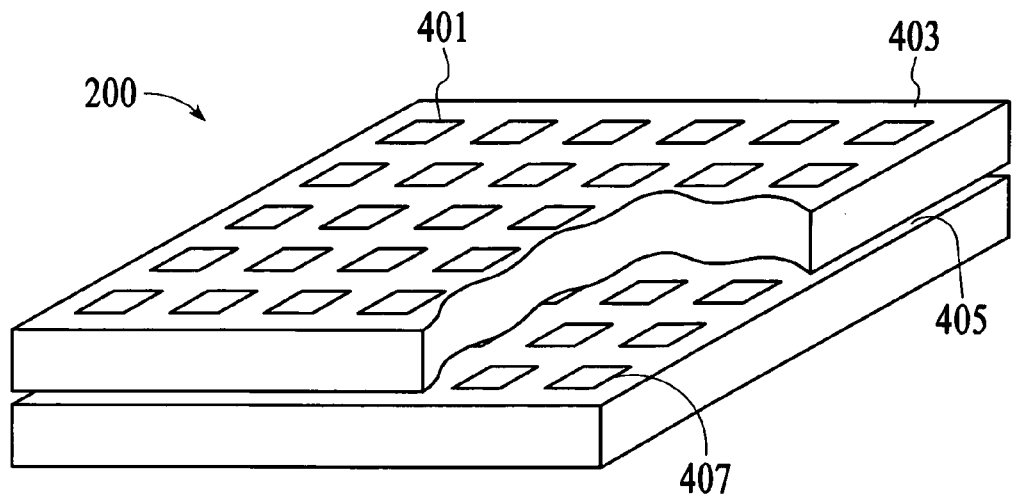
FIG. 4 is an isometric view of a flip-chip embodiment of a MEMS oscillator array.

FIG. 4 is an isometric view of a "flip-chip" array 200 of MEMS oscillators. In this embodiment, an array of MEMS resonators 401 is formed on a first substrate 403, with a corresponding array of MOS signal amplifiers 407 formed on a second substrate 405. Conductive connectors (not shown) connect specific MEMS resonators 401 to corresponding amplifiers 407 to form the "flip-chip" array of MEMS oscillators. By utilizing an array of MEMS resonators formed on a single substrate as depicted in FIG. 4, a large number of different frequencies (e.g., tens to hundreds) can be generated using a component that is small in size and inexpensive to fabricate. Although MEMS oscillators are formed using two different substrates as described with reference to FIG. 4, the present invention comprehends alternative embodiments, including embodiments wherein MEMS oscillators are formed on a single substrate.

Technical background on MEMS resonators and on flip-chip bonding of a MEMS resonator with an MOS signal amplifier to form a MEMS oscillator can be found in the articles "A 300-μW 1.9 GHz CMOS Oscillator Utilizing Micromachined Resonators" by Brian P. Otis and Jan M. Rabaey, published in the IEEE Journal of Solid-State Circuits, Vol. 38, No. 7, July 2003, and "An Ultra-Low Power MEMS-Based Two-Channel Transceiver or Wireless Sensor Networks" by B. P Otis, Y. H. Chee, R. Lu, N. M. Pletcher and J. M. Rabaey of the Department of Electrical Engineering and Computer Science at the University of California, Berkeley, 2108 Allston Way, Suite 200, Berkeley, Calif. 74704. Both of these articles are herein incorporated by reference.

Figure 5A:
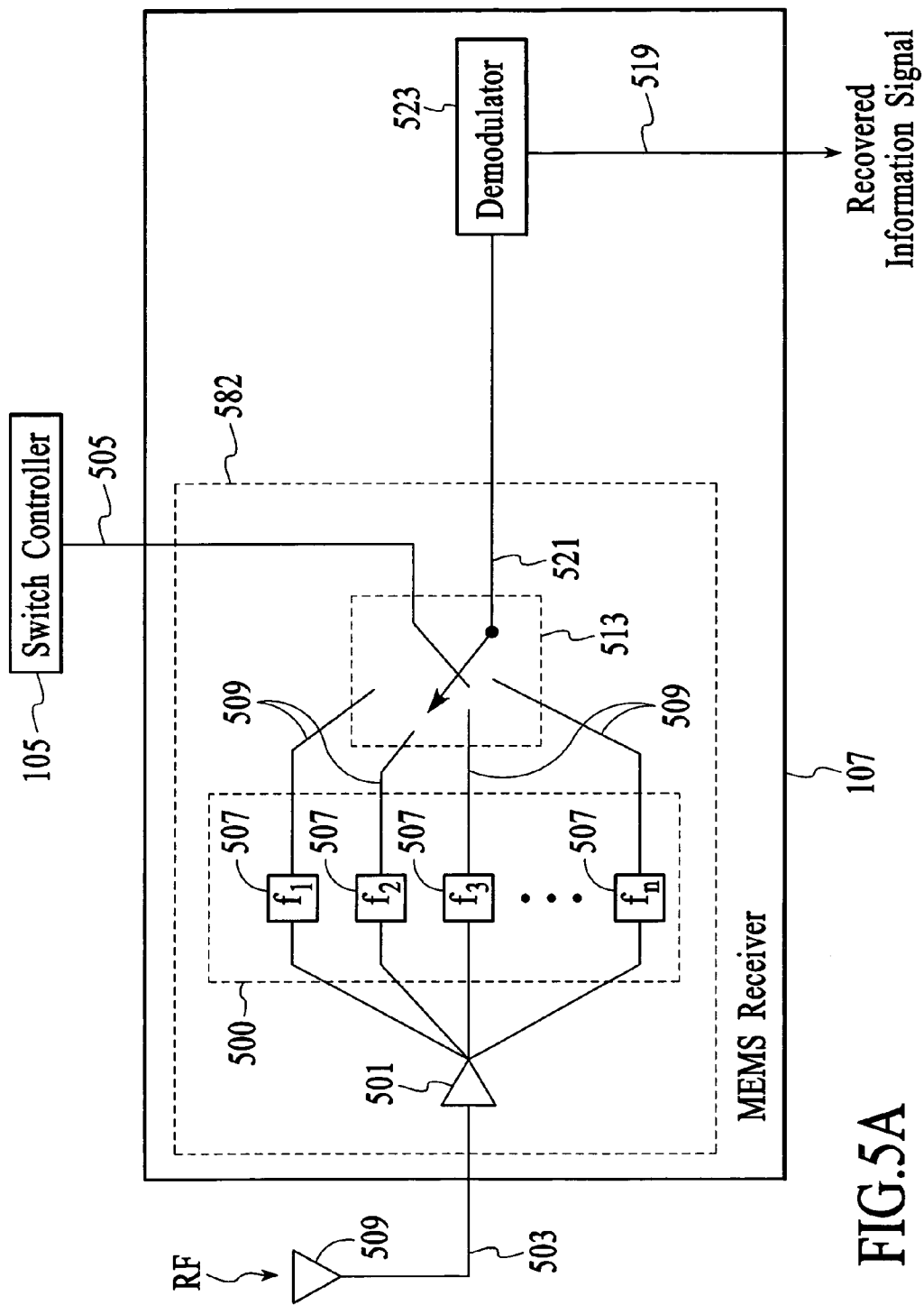
FIG. 5A depicts an embodiment of the MEMS receiver shown in FIG. 1.

A MEMS resonator resonates at a pre-determined frequency according to the dimensions of its respective components. Accordingly, when receiving an incoming signal, a MEMS resonator will pass a signal having a frequency corresponding to its own resonant frequency, and will filter out the other carrier frequencies. FIG. 5A depicts an embodiment of the MEMS receiver 107 from FIG. 1 that includes a MEMS-based frequency selection system 582 and a demodulator 523. The MEMS-based frequency selection system includes a fan-out amplifier 501, an array 500 of MEMS resonators 507, and a controllable switch 513. Components that function cooperatively with the MEMS receiver to receive a frequency-hopped carrier signal include the antenna 109 and the switch controller 105. In the array of MEMS resonators, each MEMS resonator is configured to resonate at a different one of the frequencies among the predetermined set of frequencies $f_1$-$f_n$. The MEMS resonators are also configured with a bandwidth that is wide enough to receive the corresponding frequency. The MEMS resonators will pass a signal at their respective resonant frequencies and filter out other frequencies, including noise.

Figure 6:
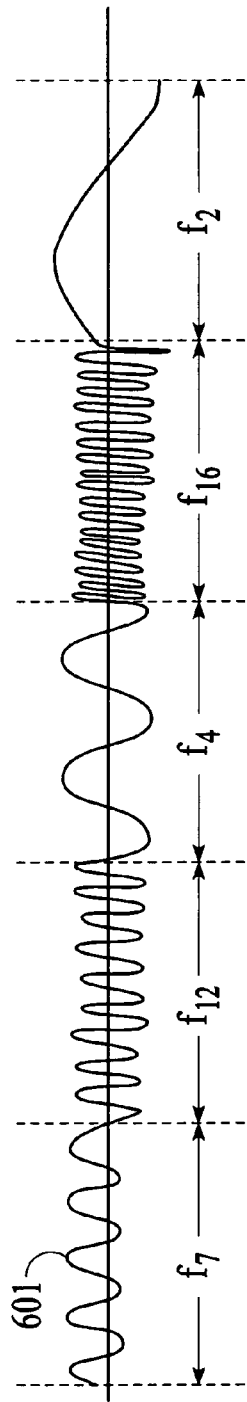
FIG. 6 depicts a frequency-hopped carrier signal produced by the MEMS transmitter of FIG. 2.

FIG. 6 depicts a portion of an exemplary frequency-hopped carrier signal 601 in which exemplary component frequencies $f_7$, $f_{12}$, $f_4$, $f_{16}$ and $f_2$ have been sequentially transmitted over a period of time by a frequency-hopping spread spectrum transmitter. The sequence of the component frequencies and their respective durations are determined by the frequency hopping algorithm. According to the embodiment depicted in FIG. 6, the carrier signal is transmitted at each of the representative frequencies $f_7$, $f_{12}$, $f_4$, $f_{16}$ and $f_2$ for an equal length of time. However, embodiments are envisioned wherein the frequency-hopping algorithm utilizes diverse time durations for the various component carrier frequencies.

Returning to FIG. 5A, in operation, the antenna 109 of the MEMS receiver 107 receives an incoming frequency-hopped carrier signal and feeds the incoming signal to fan-out amplifier 501 via signal path 503. The fan-out amplifier amplifies the incoming signal, which is then distributed in parallel circuit architecture to the respective MEMS resonators 507. At any moment in time, if the frequency of the carrier signal 601 matches a particular MEMS resonator, that particular MEMS resonator will pass the received signal to its respective output 509. Because only one MEMS resonator is tuned to that particular frequency, the remaining MEMS resonators will filter out the signal. As the frequency-hopped carrier signal is being received, the switch controller 105 generates a control signal using a frequency-hopping algorithm and transmits the control signal to the controllable switch 513 via signal path 505. The control signal directs the controllable switch to select one resonator output 509 at a time, in the same order as the corresponding transmitter. The order and duration of engagement of the various resonator outputs is determined by the switch controller in response to the frequency-hopping algorithm. The signal selected by the controllable switch is sent to the demodulator 523 via signal path 521. The demodulator demodulates the received signal, extracting the information that was encoded thereon in the form of a recovered information signal. In various embodiments, the recovered information signal can be used immediately such as by a speaker, processed for immediate use, such as by a secure-link digital telephone, or stored on an appropriate medium.

Figure 5B:
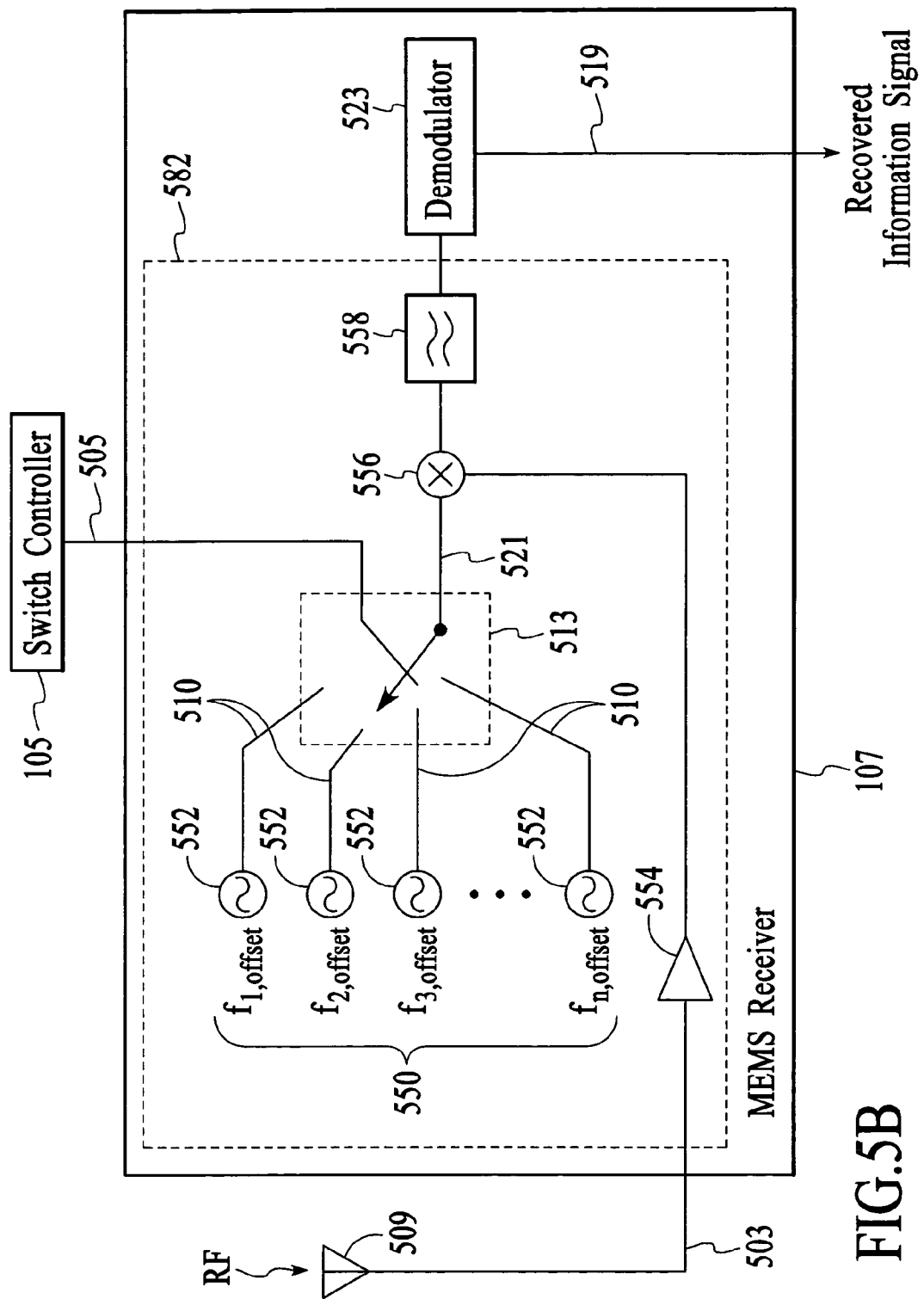
FIG. 5B depicts another embodiment of the MEMS receiver shown in FIG. 1.

In another embodiment of the MEMS receiver 107, MEMS resonators are used to form a MEMS-based superheterodyne receiver. FIG. 5B depicts an embodiment of a MEMS-based superheterodyne receiver in which the MEMS-based frequency selection system 582 includes an array 550 of MEMS oscillators 552, a controllable switch 513, an amplifier 554, a mixer 556, and an intermediate frequency (IF) filter 558. In one embodiment, the MEMS oscillators are formed using MEMS resonators as described above with reference to FIGS. 3 and 4. As is well-known in the field of superheterodyne receivers, the frequency of a local oscillator is set to an offset relative to the frequency of the received signal and the IF filter is matched to pass a frequency band that corresponds to the offset. In the MEMS receiver of FIG. 5B, the MEMS oscillators are set to generate frequencies ($f_{1,offset}$, $f_{2,offset}$, $f_{3,offset}$, ... $f_{n,offset}$) at fixed offsets relative to the transmission frequencies ($f_1$, $f_2$, $f_3$, ... $f_n$). In operation, the outputs from the MEMS oscillators are selected one at a time by the controllable switch in response to a control signal from the switch controller 105. As described above, the control signal is generated by the switch controller in response to a frequency-hopping algorithm that is the same as the frequency-hopping algorithm used to generate the transmitted signal. Although two embodiments of MEMS receivers are described with reference to FIGS. 5A and 5B, other embodiments of receivers that utilize MEMS resonators are contemplated.

The MEMS resonators within the MEMS receivers of FIGS. 5A and 5B are distinct from the MEMS resonators used to form the MEMS transmitter of FIG. 2 and the controllable switches used within the MEMS receivers are separate from the controllable switch used within the MEMS transmitter.

Figure 7:
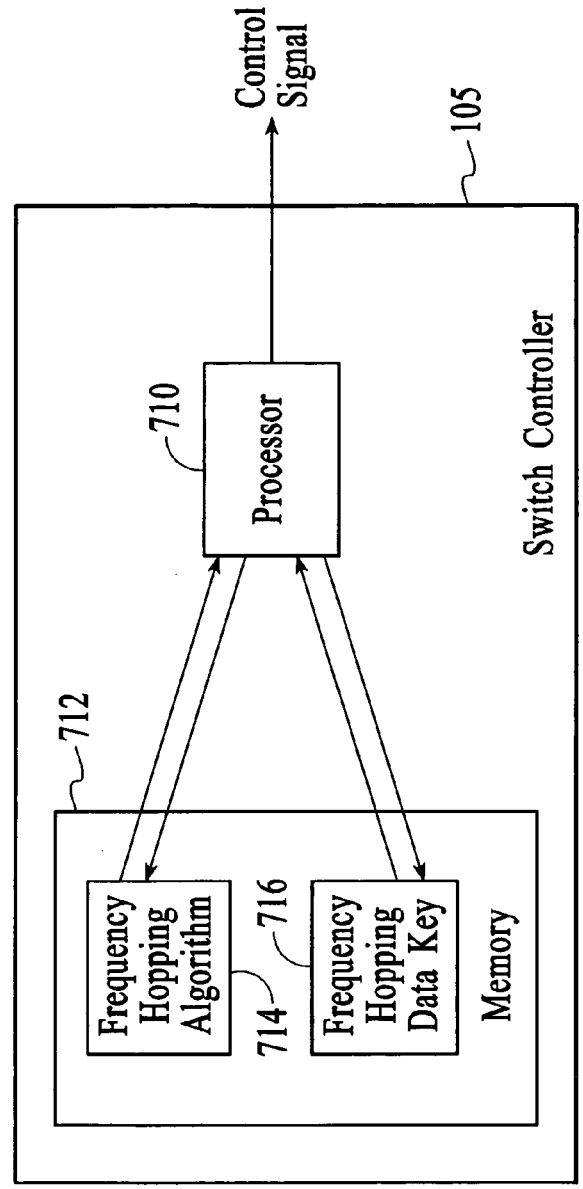
FIG. 7 is an illustration of the switch controller used in conjunction with the MEMS transmitter and MEMS receiver depicted in FIGS. 2, 5A, and 5B.

FIG. 7 depicts an embodiment of the switch controller 105 shown in FIG. 1 that includes a processor 710 and a memory 712 having a frequency-hopping algorithm 714 and a frequency-hopping data key 716 stored therein. The data key can be a data string of alpha numeric characters or binary values. In operation, the frequency-hopping algorithm and frequency-hopping data key are downloaded into the processor upon power up. The processor (e.g., a general processor or an application-specific processor) processes the frequency-hopping data key according to the frequency-hopping algorithm to generate the control signal. The control signal is transmitted along signal paths 217 and 505 (FIGS. 2 and 5, respectively) to the controllable switches 203, 513 of the MEMS transmitter 103 and the MEMS receiver 107. All transmissions and receptions are therefore encrypted and decrypted according to the frequency-hopping algorithm and data key. In other embodiments of the spread-spectrum radio, the memory stores a spread-spectrum code other than a frequency-hopping algorithm. For example, in a DSSS radio, the memory stores a direct-sequence code. In another embodiment, the memory stores a spread-spectrum code suitable for code division multiple access (CDMA) technologies.

The security offered to a user of the above-described frequency-hopping spread-spectrum radio 101 can be readily appreciated by an example wherein a first party transmits data using a frequency-hopping spread spectrum radio operating according to a first frequency-hopping algorithm 714 and a first data key 716. Even if an unauthorized listener had an identical frequency-hopping spread-spectrum radio, the unauthorized listener could not decode an encrypted frequency-hopped transmission without using an identical frequency-hopping algorithm and an identical frequency-hopping data key. By regularly updating the frequency-hopping algorithm and/or the data key, a user can further reduce the likelihood of unwanted security breaches.

One technique for synchronizing two frequency-hopping spread-spectrum radios is to initialize transmissions using a pre-determined frequency. The initial transmission will typically include a digital code or other marker indicating the beginning of the transmission. Upon receipt of the digital code, the receiving radio will initialize its own frequency-hopping algorithm. The receiving radio may transmit an "ak" acknowledging receipt of the transmission initializer. Either upon transmission of the digital code, or upon receipt of the "ak," the transmitting radio will initialize its own frequency-hopping algorithm and proceed with a transmission. The description of the above synchronization technique is exemplary and is not intended to preclude alternative synchronization techniques, including, but not limited to incorporating the real time into the frequency-hopping data key that is used by the frequency hopping algorithm to select the carrier frequency at any given moment. The real time can be synchronized on transmitting and receiving radios by, for example, embedding an accurate clock on-board both the radios or by using GPS broadcasts to continually update on-board clocks.

Figure 8:
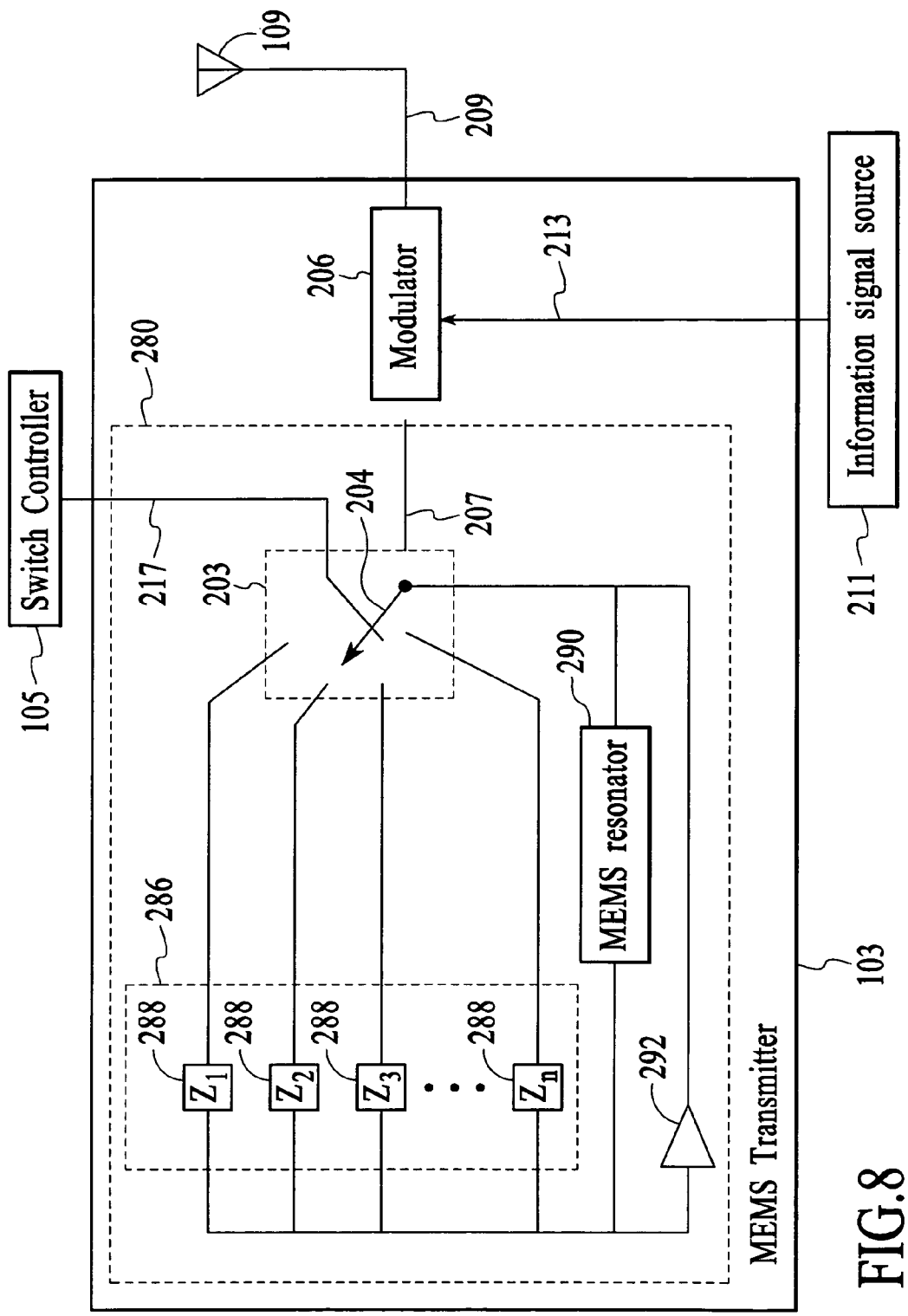
FIG. 8 depicts in greater detail another embodiment of the MEMS transmitter shown in FIG. 1.

In other embodiments, the MEMS-based oscillation system and/or the MEMS-based frequency selection system may be formed with a single MEMS resonator and a selectable bank of different impedances that are used in conjunction with the MEMS resonator to generate or select a signal at a particular frequency. FIG. 8 depicts an embodiment of the MEMS transmitter 103 from FIG. 1 that utilizes a single MEMS resonator and a selectable bank of different impedances. As depicted in FIG. 8, the MEMS-based oscillation system 280 includes an array 286 of selectable impedance elements 288, a controllable switch 203, a MEMS resonator 290, and an amplifier 292. The impedance elements exhibit different impedances and can be implemented using, for example, different MEMS resonators or highly integrated capacitors. The MEMS resonator, amplifier, and the selectable impedance elements are connected in a parallel circuit. In operation, an impedance is selected via the controllable switch and the selected impedance influences the impedance of the circuit, which in turn influences the frequency that is output from the MEMS-based oscillation system. Note that in FIG. 8 the impedance elements are represented as being in parallel with the MEMS resonator 290 to illustrate that the impedance seen by the amplifier 292 is changeable. The impedance elements may have connections to ground or other nodes in an actual circuit. In an embodiment, the amplifier is an inverting amplifier.

Figure 9:
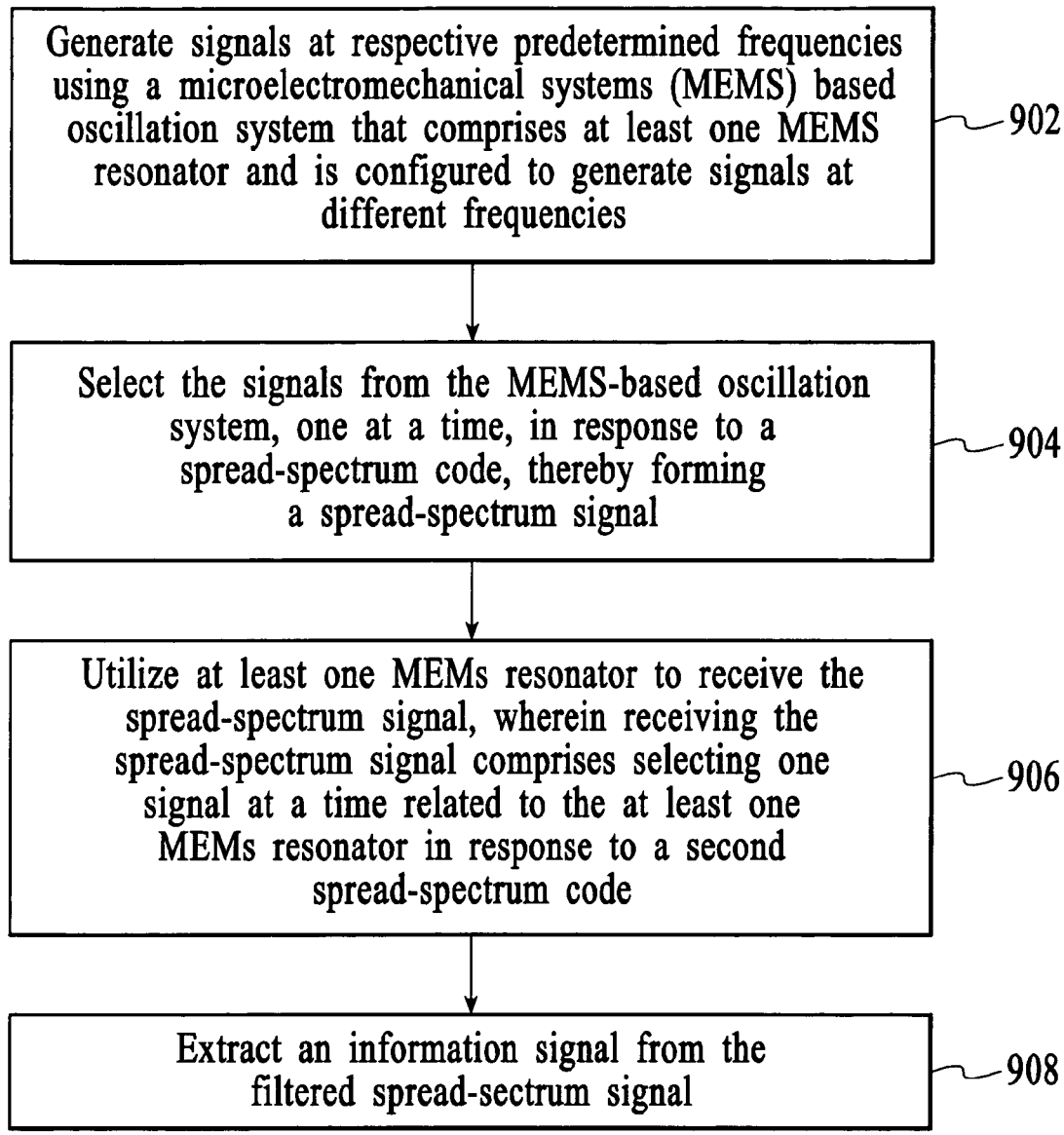
FIG. 9 is a process flow diagram of a method for communicating an information signal in accordance with an embodiment of the invention.

FIG. 9 is a process flow diagram of a method for communicating an information signal in accordance with an embodiment of the invention. At block 902, signals are generated at respective predetermined frequencies using a MEMS-based oscillation system that comprises at least one MEMS resonator and is configured to generate signals at different frequencies. At block 904, the signals are selected from the MEMS-based oscillation system, one at a time, in response to a spread-spectrum code, thereby forming a spread-spectrum signal. At block 906, at least one MEMS resonator is utilized to receive the spread-spectrum signal, wherein receiving the spread-spectrum signal comprises selecting one signal at a time related to the at least one MEMS resonator in response to a second spread-spectrum code. At block 908, an information signal is extracted from the filtered spread-spectrum signal.

Although the spread-spectrum radio (including the transmitter and/or receiver) is described for exemplary purposes as a FHSS radio, the invention applies to DSSS radios as well. A spread-spectrum radio in accordance with the invention can used to implement well-known CDMA technologies.

Although specific embodiments of the invention have been described and illustrated herein, the foregoing description has included many specific details depicting specific embodiments of the claimed invention. Many of these specific details and embodiments have been included for exemplary purposes throughout this disclosure, and are not intended to limit the scope or application of the appended claims. The scope of the invention is to be defined by the claims appended hereto and their equivalents.

What is claimed is:

1. A spread-spectrum transmitter comprising: microelectromechanical systems (MEMS) based oscillation system comprising at least one MEMS resonator and being configured to generate signals at different frequencies; and the MEMS based oscillation system further comprising a controllable switch configured to select one signal at a time within the MEMS-based oscillation system in response to a spread-spectrum code, the output from the controllable switch being a spread-spectrum signal.

2. The spread-spectrum transmitter of claim 1 further comprising a modulator configured to receive the spread-spectrum signal from the MEMS-based oscillation system and to modulate the spread-spectrum signal in response to an information signal.

3. The spread-spectrum transmitter of claim 1 wherein the MEMS-based oscillation system comprises multiple MEMS resonators configured to resonate at different frequencies.

4. The spread-spectrum transmitter of claim 1 wherein the MEMS-based oscillation system comprises multiple selectable impedance elements that exhibit different impedances.

5. The spread-spectrum transmitter of claim 1 wherein the MEMS resonator comprises a thin film bulk acoustic resonator (FBAR).

6. The spread-spectrum transmitter of claim 1 wherein the MEMS-based oscillation system further comprises a signal amplifier electrically connected to the MEMS resonator.

7. The spread-spectrum transmitter of claim 6 wherein the amplifier is fabricated on a first substrate and the MEMS resonator is fabricated on a second substrate.

8. The spread-spectrum transmitter of claim 7 wherein the first substrate is flip-chip bonded to the second substrate.

9. The spread-spectrum transmitter of claim 1 wherein the spread-spectrum code is one of a frequency-hopping spread-spectrum code or a direct-sequence spread-spectrum code.

10. The spread-spectrum transmitter of claim 1 wherein the controllable switch selects signals in a pseudo-random order.

11. A spread-spectrum receiver comprising: an antenna; microelectromechanical systems (MEMS) based frequency selection system comprising at least one MEMS resonator and configured to pass a signal at a selected frequency, wherein the selected frequency is included in a predetermined set of frequencies; and the MEMS-based frequency selection system further comprising a controllable switch configured to select one output at a time within the MEMS-based frequency selection system in response to a spread spectrum code, the output from the MEMS-based frequency selection system being a spread-spread-spectrum signal.

12. The spread-spectrum receiver of claim 11 further comprising a demodulator configured to receive the spread-spectrum signal from the MEMS-based frequency selection system and to extract an information signal therefrom.

13. The spread-spectrum receiver of claim 11 wherein the MEMS-based frequency selection system comprises multiple MEMS resonators configured to resonate at respective ones of the predetermined set of frequencies.

14. The spread-spectrum receiver of claim 11 wherein the MEMS-based frequency selection system comprises multiple MEMS resonators connected to output local oscillator signals at frequencies that correspond to the frequencies of the respective MEMS resonators.

15. The spread-spectrum receiver of claim 11 wherein the MEMS-based frequency selection system comprises multiple selectable impedance elements that exhibit different impedances.

16. The spread-spectrum receiver of claim 11 wherein the MEMS resonator comprises a thin film bulk resonator (FBAR).

17. The frequency-hopping spread-spectrum receiver of claim 16 comprising multiple FBARS wherein the FBARs are fabricated on the same substrate.

18. A method for transmitting a modulated, spread-spectrum signal by a first radio, the method comprising: generating signals at predetermined frequencies using a microelectromechanical systems (MEMS) based oscillation system that comprises at least one MEMS resonator and is configured to generate signals at different frequencies; and selecting the signals from the MEMS-based oscillation system, one at a time, in response to a spread-spectrum code, thereby forming a spread-spectrum signal.

19. The method according to claim 18 further comprising: modulating the spread-spectrum signal in response to an information signal; and transmitting the modulated spread-spectrum signal.

20. The method according to claim 18 further comprising decoding the spread-spectrum signal at a second radio, the decoding comprising: utilizing at least one MEMS resonator to receive the spread-spectrum signal, wherein receiving the spread-spectrum signal comprises selecting one signal at a time related to the at least one MEMS resonator in response to a second spread-spectrum code; and extracting an information signal from the received spread-spectrum signal.

21. The method according to claim 20 further comprising synchronizing the first and second spread-spectrum codes.

* * * * *

UNITED STATES PATENT AND TRADEMARK OFFICE
CERTIFICATE OF CORRECTION

PATENT NO. : 7,429,904 B2 Page 1 of 1
APPLICATION NO. : 11/262178
DATED : September 30, 2008
INVENTOR(S) : William R. Trutna, Jr. et al.

It is certified that error appears in the above-identified patent and that said Letters Patent is hereby corrected as shown below:

Column 8, Line 50, (Approx.), Claim 11, delete "spread-spread-"
      and insert -- spread- --.

Signed and Sealed this

Ninth Day of November, 2010

David J. Kappos
*Director of the United States Patent and Trademark Office*